United States Patent
Nakao

(10) Patent No.: US 7,786,703 B2
(45) Date of Patent: Aug. 31, 2010

(54) ELECTRONIC DEVICE, BATTERY PACK, AND ELECTRONIC DEVICE SYSTEM

(75) Inventor: Kunihisa Nakao, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 12/163,347

(22) Filed: Jun. 27, 2008

(65) Prior Publication Data

US 2009/0009176 A1    Jan. 8, 2009

(30) Foreign Application Priority Data

Jul. 5, 2007    (JP) .............................. 2007-177631

(51) Int. Cl.
*H02J 7/04* (2006.01)
*H02J 7/16* (2006.01)

(52) U.S. Cl. ...................... 320/149; 320/126; 320/132; 307/65

(58) Field of Classification Search ................. 320/149, 320/126
See application file for complete search history.

(56) References Cited

U.S. PATENT DOCUMENTS

| | | | |
|---|---|---|---|
| 5,652,499 A | * | 7/1997 | Morita et al. ............... 320/112 |
| 6,034,507 A | * | 3/2000 | Ikawa et al. ................. 320/136 |
| 6,741,065 B1 | * | 5/2004 | Ishii et al. .................... 320/122 |
| 6,910,143 B2 | * | 6/2005 | Odaohhara et al. .......... 713/340 |
| 6,979,977 B2 | * | 12/2005 | Amano et al. ............... 320/104 |
| 7,019,488 B2 | * | 3/2006 | Nakao ......................... 320/104 |

FOREIGN PATENT DOCUMENTS

JP    2007-080618    3/2007

* cited by examiner

*Primary Examiner*—Edward Tso
*Assistant Examiner*—Ramy Ramadan
(74) *Attorney, Agent, or Firm*—Cowan, Liebowitz & Latman, P.C.

(57) ABSTRACT

An electronic device which is capable of performing high-accuracy remaining battery capacity management. The electronic device has a plurality of battery pack compartments assigned specific addresses, respectively. A remaining capacity-detecting unit detects the remaining battery capacity of a battery pack mounted in a battery pack compartment. A control microcomputer receives information indicative of a remaining battery capacity sent from a battery pack accommodated in one of the battery pack compartments and address information on the battery pack compartment, and sends correction information concerning the remaining battery capacity to the battery pack.

5 Claims, 4 Drawing Sheets

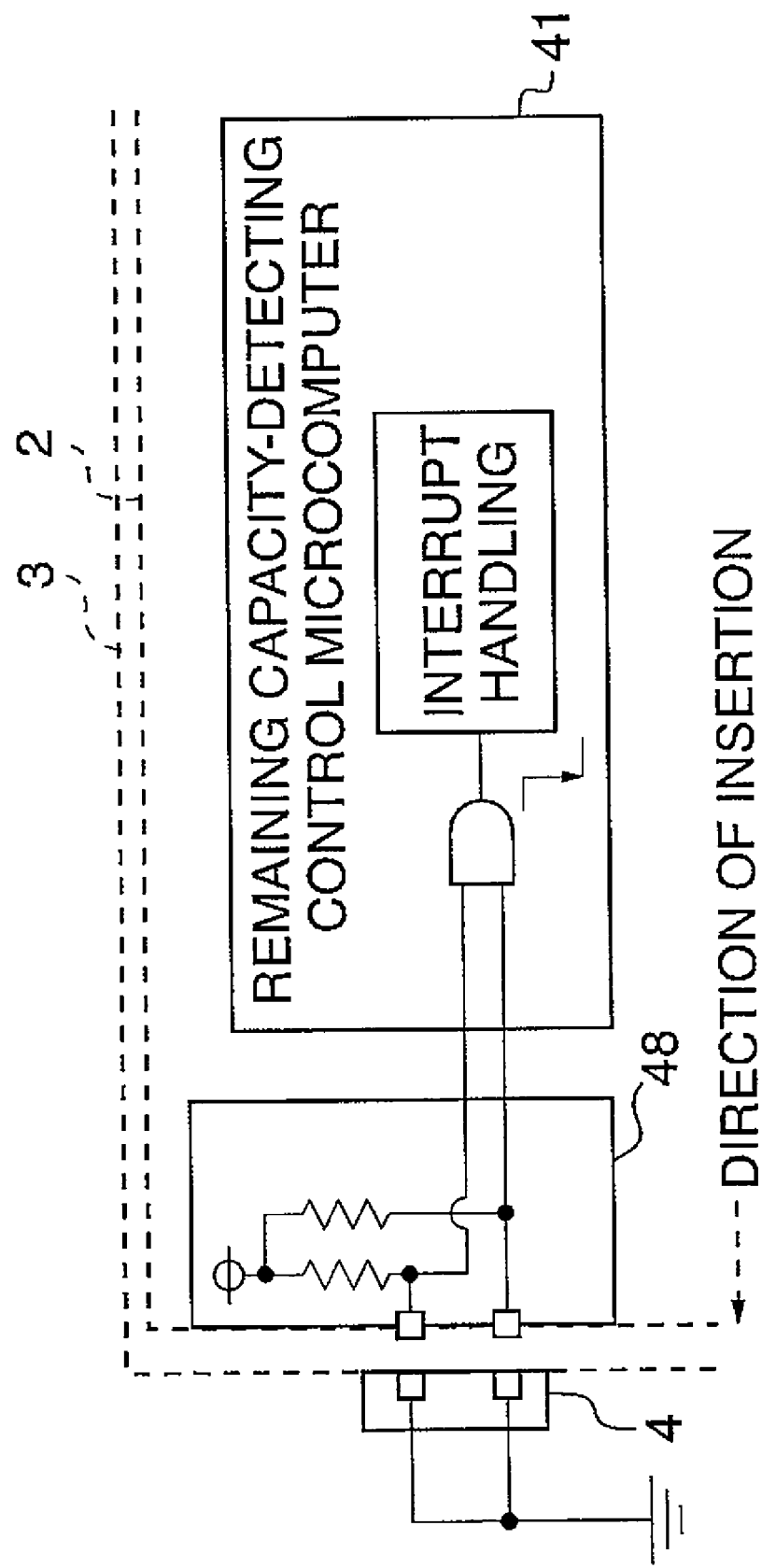

ELECTRONIC DEVICE, BATTERY PACK, AND ELECTRONIC DEVICE SYSTEM

BACKGROUND OF THE INVENTION

1. Field of the Invention

The present invention relates to an electronic device, a battery pack, and an electronic device system.

2. Description of the Related Art

Some electronic devices or accessory devices attachable to electronic devices are provided with one or more battery pack compartments for mounting one or more rechargeable battery packs, respectively, and each of the electronic devices is used with one or more battery packs having a remaining capacity-detecting capability, mounted in the battery pack compartment(s)(see Japanese Patent Laid-Open Publication No. 2007-80618). In this case, resistance is different depending on a transmission line from contact terminals of the battery pack compartment and a line path through a battery switching circuit, and the power supply voltage of the electronic device supplied by the battery pack becomes lower as the resistance is larger.

The lower limit of operating voltage of the electronic device is the same condition applied to each battery, and hence if the resistance increase, a voltage drop caused by the resistance makes it impossible to use part of the whole battery capacity expected to be available from the battery pack. In a rechargeable battery pack having the remaining capacity-detecting capability, it is required to set a relative apparent or nominal available capacity of the battery pack as 100%, and therefore the part of the battery capacity that cannot be used is left uncorrected, which produces an error.

Further, a battery pack mounted in an accessory device can function as a power supply not only for an electronic device, but also for the accessory device. In such a case, when the amount of electric current consumed by the accessory device is much smaller than that of electric current consumed by the electronic device, it is impossible to measure the former by an electric current detection circuit provided in the battery pack, and hence an error is caused by the integral of electric current continuously consumed by the accessory device.

In the prior art, it is possible to detect whether or not an accessory device is attached to an electronic device, but when two or more battery packs are mounted in the electronic device and the accessory device, it is impossible to determine which of the battery packs mounted in one of the electronic device and the accessory device is supplying power. For this reason, for the battery packs mounted in the electronic device and the accessory device, it is impossible to correct differences in the aforementioned resistance separately between the battery packs, which causes an error in a result of detection of the remaining battery capacity of each battery pack.

Further, in a case where two or more battery packs are mounted in an accessory device, it is impossible to detect the configuration of the battery packs, and hence it is also impossible to determine how undetectable electric current is being consumed by which of the battery packs. Thus, the prior art cannot make it possible to accurately correct an error corresponding to the integral of undetectable electric current consumed by each of the battery packs.

Moreover, when a battery pack is mounted anew in an electronic device or in an accessory device, the prior art compels the battery pack to wait for an instruction from a control microcomputer of the electronic device before the battery pack performs remaining capacity correction, and the integral of electric current consumed at the time causes an error.

SUMMARY OF THE INVENTION

The present invention provides an electronic device, a battery pack, and an electronic device system, which are capable of performing high-accuracy remaining battery capacity management.

In a first aspect of the present invention, there is provided an electronic device communicable with a battery pack accommodated therein, the battery pack including a remaining capacity-detecting unit that detects a remaining battery capacity of the battery pack, comprising a plurality of battery pack compartments assigned specific addresses, respectively, and a control unit configured to receive information indicative of a remaining battery capacity sent from the battery pack accommodated in one of the battery pack compartments and address information on the one of the battery pack compartment, and send correction information concerning the remaining battery capacity of the battery pack to the remaining capacity-detecting unit of the battery pack.

According to the electronic device of the present invention, it is possible to perform high-accuracy remaining battery capacity management.

In a second aspect of the present invention, there is provided a battery pack that can be accommodated in an electronic device including a plurality of battery pack compartments assigned specific addresses, respectively, and a control unit that communicates with a battery pack accommodated in each of the battery pack compartments, comprising a mounting position-detecting unit configured to detect the specific address of each battery pack compartment, a remaining capacity-detecting unit configured to detect a remaining battery capacity, and a communication unit configured to transmit information indicative of the remaining battery capacity detected by the remaining capacity-detecting unit, and the address information on the battery pack compartment detected by the mounting position-detecting unit, to the control unit.

In a third aspect of the present invention, there is provided an electronic device system comprising an electronic device, and a battery pack that can be accommodated in the electronic device, wherein the electronic device comprises a plurality of battery pack compartments assigned specific addresses, respectively, and a control unit, wherein the battery pack comprises a mounting position-detecting unit configured to detect the specific address of each battery pack compartment, a remaining capacity-detecting unit configured to detect a remaining battery capacity, and a communication unit configured to transmit information indicative of the remaining battery capacity detected by the remaining capacity-detecting unit, and the address information on the battery pack compartment detected by the mounting position-detecting unit, to the control unit, and wherein the control unit is configured to receive the information indicative of the remaining battery capacity and the address information from the battery pack, and send correction information concerning the remaining battery capacity to the battery pack.

The features and advantages of the invention will become more apparent from the following detailed description taken in conjunction with the accompanying drawings.

BRIEF DESCRIPTION OF THE DRAWINGS

FIG. 4 is a circuit diagram of a remaining battery capacity management information update request unit (update request unit) in the battery pack appearing in FIG. 1.

DETAILED DESCRIPTION OF THE EMBODIMENTS

The present invention will now be described in detail with reference to the drawings showing a preferred embodiment thereof.

Figure 1:
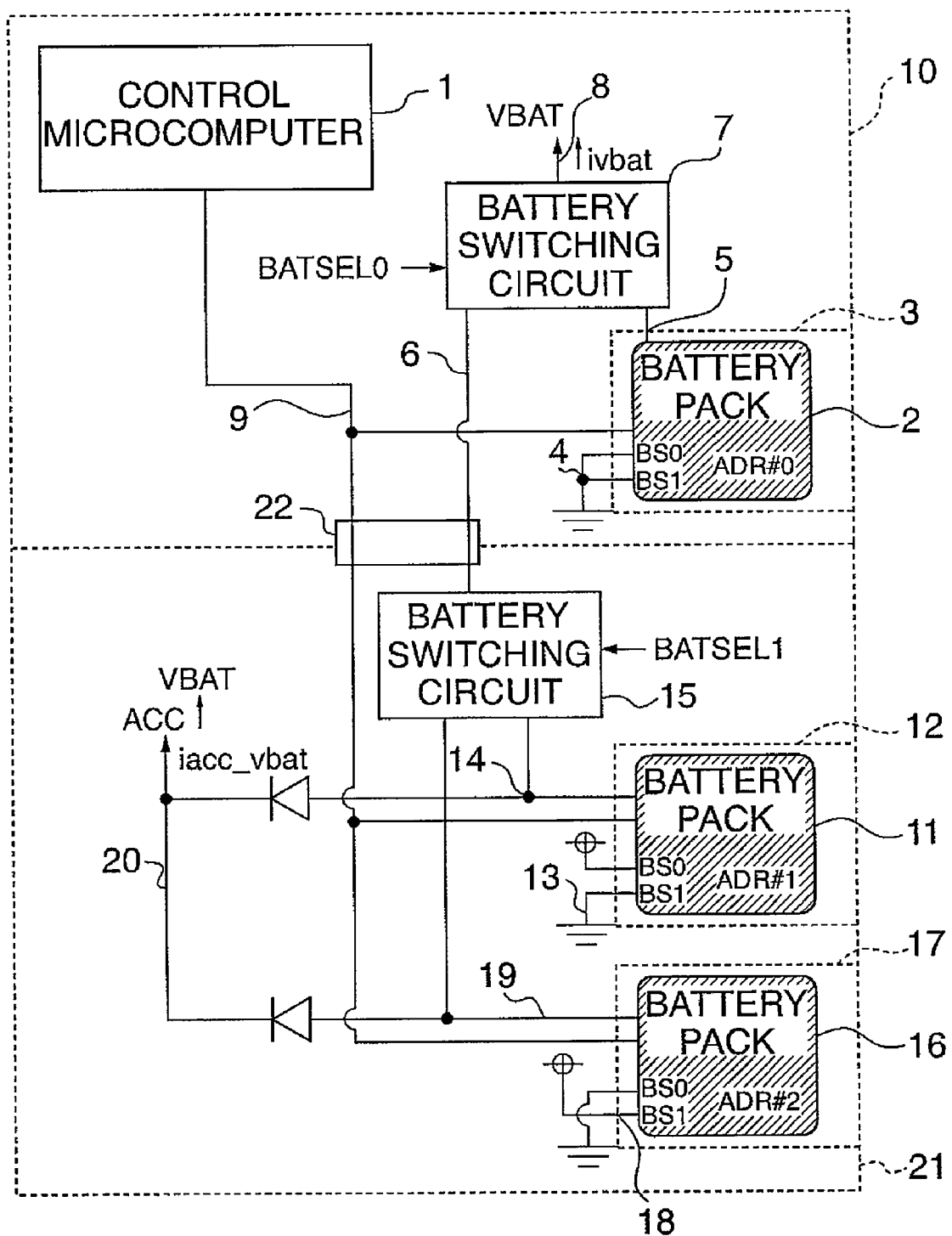
FIG. 1 is a block diagram of an electronic device according to an embodiment of the present invention and an accessory device.
Figure 2:
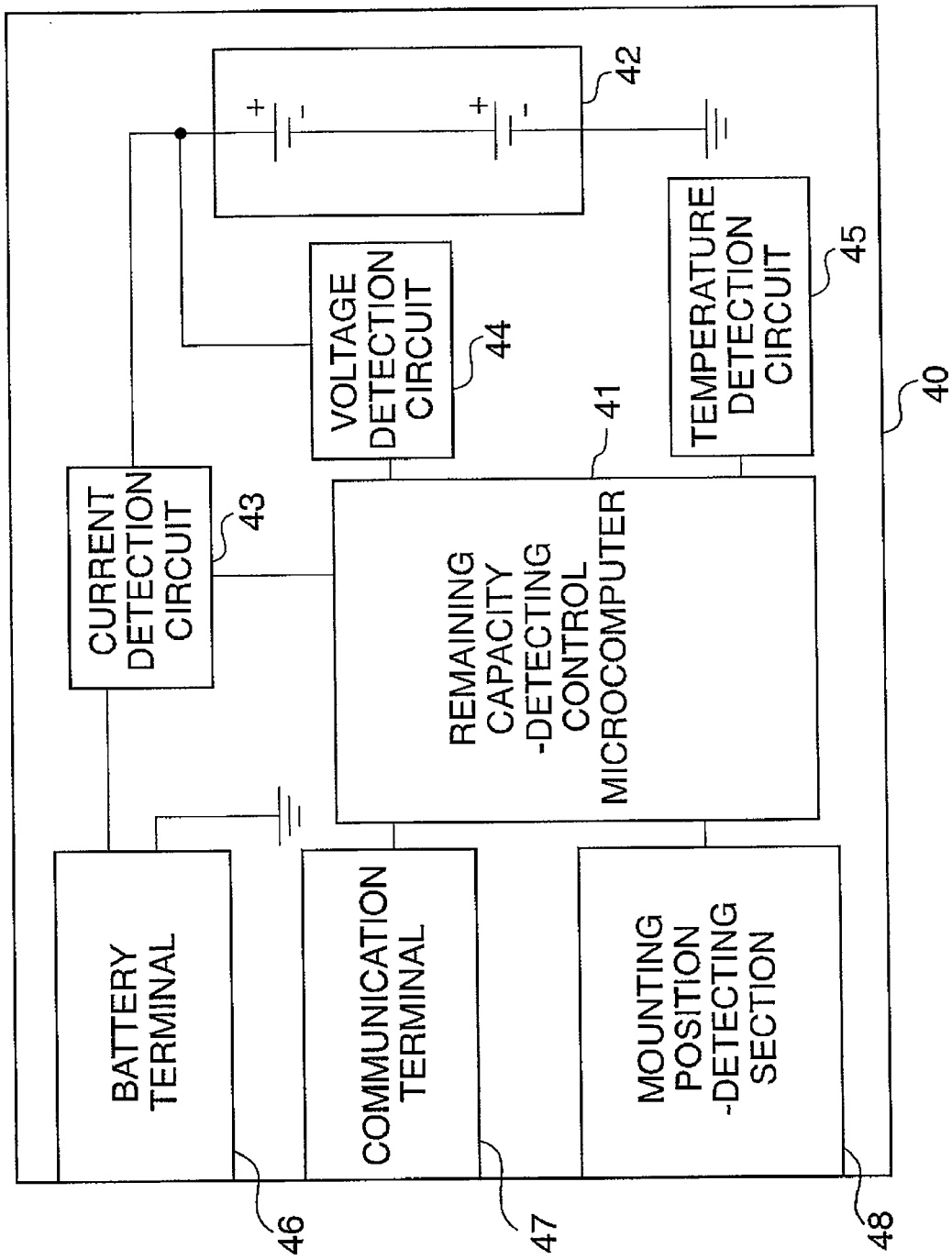
FIG. 2 is a block diagram of a battery pack that is mounted in the electronic device or the accessory device in FIG. 1.

FIG. 1 is a block diagram of an electronic device according to an embodiment of the present invention and an accessory device. FIG. 2 is a block diagram of a battery pack that is mounted in the electronic device or the accessory device in FIG. 1.

The electronic device 10 is comprised of a control microcomputer 1, a battery pack compartment 3 which can accommodate a battery pack 2, and a battery switching circuit 7.

Similarly, the accessory device 21 is comprised of a battery pack compartment 12 which can accommodate a battery pack 11, a battery switching circuit 15, and a battery pack compartment 17 which can accommodate a battery pack 16. The accessory device 21 thus includes a plurality of battery pack compartments.

The control microcomputer 1 (control unit) is communicable with each of the battery packs, and controls both the electronic device 10 and the accessory device 21. The battery pack compartment 3 has terminals for electrically connecting the battery pack 2 to a battery voltage output line 5, a communication signal line 9 for communication with the control microcomputer 1, and a mounting position detection signal line 4, respectively.

The mounting position detection signal line 4 has two bits (BS0/BS1) as an address of the battery pack 2, and electrically outputs the bit BS0=L level and the bit BS1=L level to indicate an address #0 assigned to the battery pack compartment 3.

The control microcomputer 1 selects a battery to be connected to a power supply voltage VBAT line 8 for supplying power to the whole electronic device 10, using the battery switching circuit 7 via a control signal BATSEL0, depending on whether or not the accessory device 21 is connected to the electronic device 10 and the remaining capacities of the respective battery packs 2, 11, and 16. More specifically, the control microcomputer 1 causes the battery switching circuit 7 to switch between connection of the power supply voltage VBAT line 8 to the battery voltage output line 5 connected to the battery pack 2 and connection of the power supply voltage VBAT line 8 to a battery voltage output line 6 connected to the accessory device 21.

The accessory device 21 establishes electrical connection to the electronic device 10 via accessory device connection terminals 22. Connected to the accessory device connection terminals 22 are the battery voltage output line 6 connected to one of the battery pack 11 and the battery pack 16 which is selected by the battery switching circuit 15, and the communication signal line 9 for communication with the control microcomputer 1. A battery selection signal BATSEL1 is input to the accessory device connection terminals 22.

Similarly to the battery switching circuit 7 of the electronic device 10, the battery switching circuit 15 switches between respective connections to a battery voltage output line 14 and a battery voltage output line 19 connected respectively to the battery pack 11 and the battery pack 16 in the accessory device 21, based on the battery selection signal BATSEL1 from the control microcomputer. Thus, the supply of battery voltage to the battery voltage output line 6 is switched.

The battery pack compartment 12 within the accessory device 21 has terminals for electrically connecting the battery pack 11 to the battery voltage output line 14, the communication signal line 9 for communication with the control microcomputer 1, and a mounting position detection signal line 13, respectively. Similarly, the battery pack compartment 17 has terminals for electrically connecting the battery pack 16 to the battery voltage output line 19, the communication signal line 9 for communication with the control microcomputer 1, and a mounting position detection signal line 18, respectively.

The mounting position detection signal line 13 has two bits (BS0/BS1) as an address of the battery pack 11, and electrically outputs the bit BS0=H level and the bit BS1=L level to indicate an address #1 assigned to the battery pack compartment 12. Further, the mounting position detection signal line 18 has two bits (BS0/BS1) as an address of the battery pack 16, and electrically outputs the bit BS0=L level and the bit BS1=H level to indicate an address #2 assigned to the battery pack compartment 17.

The mounting position detection signal lines 4, 13, and 18 are thus assigned the respective addresses #0, #1, and #2, which enables each battery pack to detect which of the battery pack compartment in the electronic device and the battery pack compartments in the accessory device the battery pack has been mounted in.

Further, in the accessory device 21, an output via the battery voltage output line 14 connected to the battery pack 11 and an output via the battery voltage output line 19 connected to the battery pack 16 are supplied to a power supply voltage ACC_VBAT line 20 via respective diodes for use as the power supply.

Now, a load current flowing in the power supply voltage (power supply) VBAT line 8 of the electronic device 10 is represented by [ibat], and a load current flowing in the power supply line ACC_VBAT 20 of the accessory device 21 by [iacc_vbat].

When [ibat]>>[iacc_vbat] holds, the load current [iacc_vbat] cannot be measured by the current detection circuit of the battery pack. However, the load current [iacc_vbat] is also continuously consumed, and hence it becomes large enough to influence the remaining capacity of the battery pack as time elapses.

Therefore, the control microcomputer 1 delivers undetectable electric current correction information as follows, according to a relation between a battery voltage VBP (11) of the battery pack 11 and a battery voltage VBP (16) of the battery pack 16, which is determined based on battery voltage information on the battery packs 11 and 16.

When VBP (11)>VBP (16) holds, undetectable electric current correction information of [iacc_vbat] is delivered to the battery pack 11 alone, whereas when VBP (11)<VBP (16) holds, the undetectable electric current correction information of [iacc_vbat] is delivered to the battery pack 16 alone.

Further, when VBP (11)=VBP (16) holds, undetectable electric current correction information of [iacc_vbat/2] is delivered to both the battery pack 11 and the battery pack 16.

Thus, in each of the battery packs 11 and 16, it is possible to subtract [elapsed time]×[received undetectable electric current correction information] from a remaining capacity to thereby achieve high-accuracy remaining battery capacity management.

Referring to FIG. 2, the battery packs 2, 11, and 16 are all identical in construction, and the identical construction is shown as a battery pack 40.

A remaining capacity-detecting control microcomputer 41 of the battery pack 40 calculates battery charge by sequentially integrating a charge or discharge current value which is detected by a current detection circuit 43 and is indicative of electric current charged into or discharged from a cell pack 42 formed by two rechargeable secondary battery cells in series, to thereby manage the remaining capacity of the battery pack. The remaining capacity-detecting control microcomputer 41 forms a remaining capacity-detecting unit.

Further, using a voltage detection circuit 44 for monitoring the voltage of the cell pack 42 and a temperature detection circuit 45 for detecting the temperature of the battery pack itself, the remaining capacity-detecting control microcomputer 41 performs computation for correcting a discharge efficiency influenced by the voltage of the cell pack 42 and the temperature of the battery pack.

Further, the remaining capacity-detecting control microcomputer 41 receives, from the microcomputer 1, correction information on undetectable electric current which cannot be measured by the current detection circuit 43 depending on the operation mode of the electronic device 10, and correction information on resistance of a transmission line leading to the power supply voltage VBAT line 8, which is different depending on the location of a battery pack compartment. Then, the remaining capacity-detecting control microcomputer 41 performs computation for correction to thereby improve the accuracy of the remaining battery capacity management.

Further, the battery pack 40 includes a battery terminal 46 for supplying battery voltage (+) (−), and a communication terminal 47 via which the remaining capacity-detecting control microcomputer 41 sends and receives supplementary information concerning the remaining battery capacity management and battery mounting position information to and from the control microcomputer 1 of the electronic device 10. The communication terminal 47 forms a communication unit. Furthermore, the battery pack 40 includes a mounting position-detecting section 48 for detecting which of the mounting position detection signal lines 4, 13, and 18 of the respective battery pack compartments the battery pack 40 is connected. The mounting position-detecting section 48 forms a mounting position-detecting unit.

The mounting position-detecting section 48 as the mounting position-detecting unit detects each of respective addresses specific to the battery pack compartment provided in the electronic device 10 and the battery pack compartments provided in the accessory device 21.

The remaining capacity-detecting control microcomputer 41 as the remaining capacity-detecting unit detects the remaining battery capacity of the battery pack mounted in the battery pack compartment.

The communication terminal 47 as the communication unit sends information indicative of the remaining battery capacity detected by the remaining capacity-detecting unit and address information on the battery pack compartment detected by the mounting position-detecting unit to the electronic device 10. Further, the communication terminal 47 receives correction information concerning the remaining battery capacity of the battery pack to be supplied to the remaining capacity-detecting control microcomputer 41 as the remaining capacity-detecting unit, from the electronic device 10.

The correction information concerning the remaining battery capacity of the battery pack includes capacity offset information dependent on each battery pack compartment in which the battery pack 40 is mounted.

Figure 3:
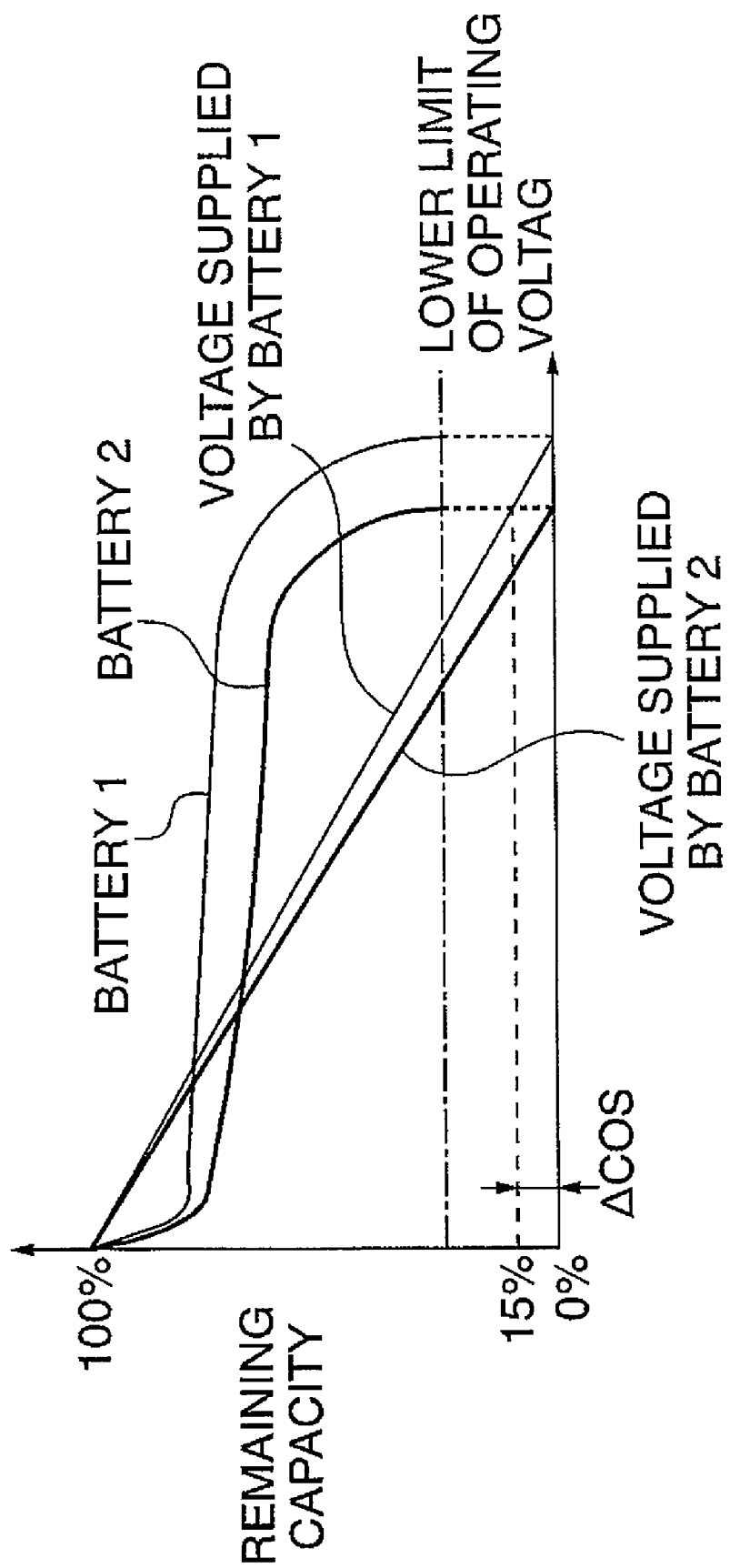
FIG. 3 is a graph schematically showing resistance-dependent different discharge characteristics of the battery pack in FIG. 2 and the relationship between the remaining capacity and the discharge capacity thereof.

FIG. 3 is a graph schematically showing resistance-dependent different discharge characteristics of the battery pack in FIG. 2 and the relationship between the remaining capacity and the discharge capacity thereof.

In FIG. 3, the battery 1 is accommodated in the electronic device 10, and a transmission line connected to the battery 1 for outputting voltage has a relatively small resistance, while the battery 2 is accommodated in the accessory device 21, and a transmission line connected to the battery 2 for outputting voltage has a larger resistance than that of the transmission line connected to the battery 1.

In this case, when a comparison is made between the discharge characteristic of the battery 1 and the discharge characteristic of the battery 2, it is understood that a voltage supplied by the battery 2 and detected in the power supply section of the electronic device continues to be lower as it changes than a voltage supplied by the battery 1 and detected in the same, due to the larger amount of resistance of the transmission line. The lower limit of operating voltage to be supplied by a battery as the power source to the electronic device defines the same condition uniformly applied to the batteries 1 and 2. The voltage supplied by the battery 2, which continues to be lower than that supplied by the battery 1, reaches the lower limit of operating voltage earlier than the voltage supplied by the battery 1, which makes the discharge capacity of the battery 2 smaller than that of the battery 1.

When this characteristic is expressed in terms of remaining battery capacity, the remaining capacity of the battery pack with no power consumed after having been charged is set to 100%, and assuming that the remaining capacity of the battery pack at a time point when the battery 1 has reached a predetermined discharge capacity is equal to 0%, the voltage of the battery 2 becomes lower than the lower limit of operating voltage before reaching the predetermined discharge capacity. The remaining capacity of the battery pack at this time is found to be equal to 15%.

However, in the electronic device, when the remaining capacity of the battery 2 is still 15%, it is impossible to indicate that the battery pack has run down. For this reason, in order to display the remaining capacity of the battery 2 as 0% even though it is actually 15%, it is required to correct the value of the remaining capacity by offsetting the remaining capacity by 15%. Therefore, a capacity offset amount [Δ COS] is sent as correction information to the battery 2, whereby the remaining battery capacity management is performed.

Further, since the aforementioned discharge capacity is different due to the difference in the respective amounts of resistance of the transmission channels from the respective battery pack compartments to the power supply of the electronic device, a plurality of offset amounts [Δ COS] are sent as correction information on the respective batteries based on their addresses. This makes it possible to correct the differences in the remaining capacity between the batteries, thereby attaining high-accuracy remaining battery capacity management.

FIG. 4 is a circuit diagram of a remaining battery capacity management information update request unit (update request unit) in the battery pack appearing in FIG. 1.

In FIG. 4, the same components as those of the electronic device, the accessory device, and the battery pack shown in FIGS. 1 and 2 are denoted by the same reference numerals, and description thereof is omitted.

The 2-bit address signal BS0/BS1 of the mounting position-detecting section 48, which is indicative of a battery mounting position, is connected to an input port of the remaining capacity-detecting control microcomputer 41, for detecting an interrupt. When a battery pack having the mounting position-detecting section 48 is alone, i.e. not mounted in a battery pack compartment, each of the two bits BS0 and BS1 is constantly held high (BS0=H, BS1=H) by the pull-up resistance.

If the battery pack is mounted in the battery pack compartment 3 of the electronic device 10 which is assigned the address #0 (BS0=L, BS1=L), both of the signal levels of the respective bits BS0 and BS1 at the input port of the battery pack change from H to L. Through interrupt handling executed at the falling edge of the signal, the remaining capacity-detecting control microcomputer 41 detects that the battery pack is mounted in the battery pack compartment 3 of the electronic device 10.

Then, a command requesting update of remaining battery capacity management information is transmitted to the control microcomputer 1 of the electronic device 10 through the communication signal line 9, whereby the control microcomputer 1 can detect the mounting of the battery pack therein.

If the battery pack is mounted in the battery pack compartment 12 of the accessory device 21 which is assigned the address #1 (BS0=H, BS1=L), the signal level of the bit BS1 at the input port of the battery pack changes from H to L. Through interrupt handling executed at the falling edge of the signal, the remaining capacity-detecting control microcomputer 41 detects that the battery pack is mounted in the battery pack compartment 12 of the accessory device 21. Further, If the battery pack is mounted in the battery pack compartment 17 of the accessory device 21 which is assigned the address #2 (BS0=L, BS1=H), the signal level of the bit BS0 at the input port of the battery pack changes from H to L. Through interrupt handling executed at the falling edge of the signal, the remaining capacity-detecting control microcomputer 41 detects that the battery pack is mounted in the battery pack compartment 17 of the accessory device 21.

While the present invention has been described with reference to an exemplary embodiment, it is to be understood that the invention is not limited to the disclosed exemplary embodiment. The scope of the following claims is to be accorded the broadest interpretation so as to encompass all modifications, equivalent structures and functions This application claims priority from Japanese Patent Application No. 2007-177631 filed Jul. 5, 2007, which is hereby incorporated by reference herein in its entirety.

What is claimed is:

1. An electronic device communicable with a battery pack accommodated therein, the battery pack including a remaining capacity-detecting unit that detects a remaining battery capacity of the battery pack, comprising:
   a plurality of battery pack compartments, an electric resistance from one of the battery pack compartments to a power supply line of the electronic device being different from electric resistances from the other battery pack compartments to the power supply line; and
   a control unit configured to receive information indicative of a remaining battery capacity sent from the battery pack accommodated in one of the battery pack compartments,
   wherein the control unit transmits correction information corresponding to the battery pack accommodated in one of the battery pack compartments, the correction information being used for correcting the remaining battery capacity of the accommodated battery pack, the correction information being based on the electric resistance from the one of the battery pack compartments to the power supply line, the correction information corresponding to the battery pack accommodated in the one of the battery pack compartments being different from the correction information corresponding to the battery packs accommodated in the other battery pack compartments.

2. An electronic device as claimed in claim 1, wherein the correction information concerning the remaining battery capacity of the battery pack sent to the remaining capacity-detecting unit includes capacity offset information associated with the one of the battery pack compartments accommodating the battery pack.

3. An electronic device as claimed in claim 1, wherein the correction information concerning the remaining battery capacity of the battery pack sent to the remaining capacity-detecting unit includes undetectable electric current correction information associated with the one of the battery pack compartments accommodating the battery pack.

4. A battery pack that can be accommodated in an electronic device including a plurality of battery pack compartments and a control unit that communicates with a battery pack accommodated in each of the battery pack compartments, each of the battery pack compartments having address information thereof, an electric resistance from one of the battery pack compartments to a power supply line of the electronic device being different from electric resistances from the other battery pack compartments to the power supply line, the battery pack comprising:
   an accommodating position-detecting unit configured to detect the address information of each battery pack compartment in which the battery pack is accommodated;
   a remaining capacity-detecting unit configured to detect a remaining battery capacity; and
   a communication unit configured to transmit information of the remaining battery capacity detected by the remaining capacity-detecting unit, and the address information of the battery pack compartment detected by the accommodating position-detecting unit, to the control unit,
   wherein the communication unit is configured to receive correction information from the control unit, the correction information being used for correcting the remaining battery capacity of the battery pack, the correction information being based on the electric resistance from one of the battery pack compartments to the power supply line, the correction information corresponding to one of the address information being different from the correction information corresponding to the other address information.

5. An electronic device system comprising an electronic device, and a battery pack that can be accommodated in the electronic device,
   wherein the electronic device comprises a plurality of battery pack compartments and a control unit, an electric resistance from one of the battery pack compartments to a power supply line of the electronic device being different from electric resistances from the other battery pack compartments to the power supply line, each of the plurality of battery pack compartments having address information thereof,
   wherein the battery pack comprises an accommodating position-detecting unit configured to detect the address information of each battery pack compartment, a remaining capacity-detecting unit configured to detect a remaining battery capacity, and a communication unit configured to transmit information of the remaining battery capacity detected by the remaining capacity-detecting unit, and the address information of the battery pack compartment detected by the accommodating position-detecting unit, to the control unit, and wherein the control unit is configured to receive the information of the remaining battery capacity and the address information from the battery pack, and send correction information used for correcting the remaining battery capacity of the battery pack, the correction information being based on the electric resistance from one of the battery pack compartments to the power supply line, the correction information corresponding to one of the address information being different from the correction information corresponding to the other address information.

* * * * *